Oct. 5, 1965 J. I. RHODES 3,210,679
BANDPASS TRANSISTOR AMPLIFIER WITH AUTOMATIC GAIN CONTROL AND ACTIVE ISOLATING MEANS
Filed Oct. 12, 1962
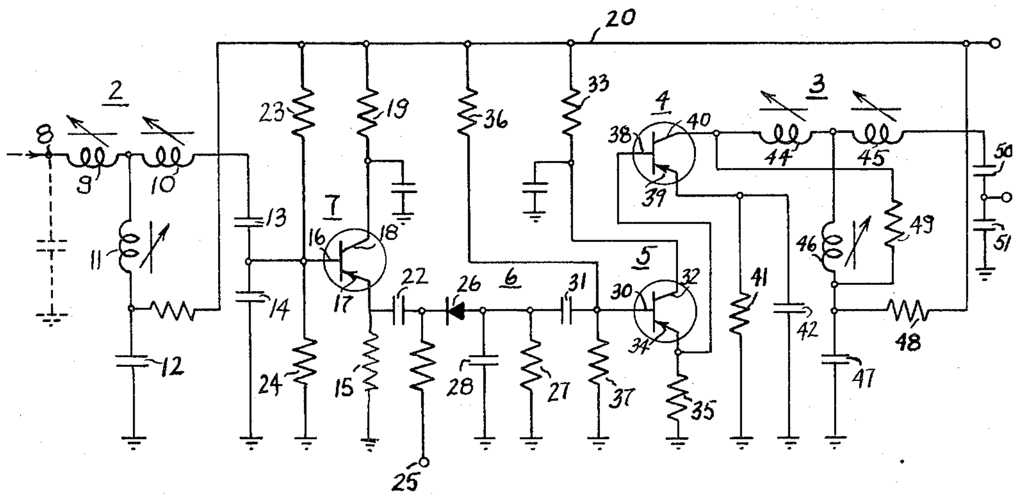
INVENTOR:
JUNIOR I. RHODES,
BY I. David Blumenfeld
HIS ATTORNEY.

3,210,679

BANDPASS TRANSISTOR AMPLIFIER WITH AUTOMATIC GAIN CONTROL AND ACTIVE ISOLATING MEANS

Junior I. Rhodes, Lynchburg, Va., assignor to General Electric Company, a corporation of New York Filed Oct. 12, 1962, Ser. No. 230,082
3 Claims. (Cl. 330—21)

This invention relates to a transistor amplifier having automatic gain control circuitry. More particularly, it relates to a bandpass, high frequency, tuned transistor amplifier wherein interaction between the frequency selective networks and the automatic gain control circuitry of the amplifier is minimized.

In a concurrently filed application entitled, "Bandpass Transistor Amplifier" (35-73D-166), Serial No. 230,047, filed on October 12, 1962, in the name of Junior I. Rhodes, and assigned to the assignee of the present invention, a bandpass, high frequency, tuned transistor amplifier circuit is described in which substantial isolation between the frequency selective networks of the amplifiers is provided. Such isolation is achieved by utilizing an active isolating element in the form of a transistor connected in the common-collector, or as it is more commonly known, "emitter-follower" configuration. The "emitter-follower" circuit isolates the reflected input and output impedances and prevents interaction between the input and output selective networks of the amplifier. Consequently, the alignment procedures for such tuned amplifiers are greatly simplified and the operational characteristics across the passband are stabilized.

The problem becomes more complex, however, if automatic gain control (AGC) is to be incorporated in such a high frequency, bandpass amplifier. The varying unidirectional AGC voltage cannot, as a rule, be applied directly to the transistor amplifier since this produces changes in the D.C. biasing of the transistor. Any such biasing changes vary the transistor operating point which in turn produce changes in the input and output impedances of the transistor. Since the transistor input and output impedances have both resistive and reactive components, both the quality factor Q and center frequency and bandpass characteristics of the frequency selective networks are affected.

One hitherto available scheme for controlling the gain of the amplifier without varying the D.C. operating point of the transistor is to use the AGC voltage to control the variable resistive element of an attenuating network located in the amplifier signal path thereby controlling the magnitude of the input signal to the amplifier. The variable resistive element is usually a semiconductor diode, such as a p-n junction, the resistance of which is varied as a function of the AGC signal. However, the use of a diode attenuator in the AGC circuit, while solving one set of problems, introduces a corresponding set of its own. That is, a diode element such as a p-n device not only has a resistive component that varies with the AGC voltage, but a capacitive reactive component which also varies. The reactive component is due to the "depletion layer" existing across the p-n junction; a layer free of carriers the width of which varies with the applied AGC voltage. This variable width "depletion layer" is effectively a voltage variable capacitor and introduces a varying reactive component.

It has been found that a single "emitter-follower" isolating stage is not adequate to isolate the varying resistive and reactive components introduced by the AGC diode, both from the amplifier input and output selective networks. It is, therefore, necessary to incorporate further circuitry to achieve bidirectional isolation against disturbances introduced by the AGC circuits.

It is, therefore, one of the primary objects of this invention to provide an automatic gain control circuit for a high frequency, bandpass transistor amplifier which includes means for isolating the disturbances introduced by the gain control circuitry.

A further object of this invention is to provide a bandpass transistor amplifier including automatic gain control circuitry and which includes at least two active isolating elements to prevent interaction between the selective networks of the amplifier and the gain control circuitry.

Further objects and advantages of the invention will become apparent as the description thereof proceeds.

In a preferred form of the invention, the various advantages hitherto enumerated are achieved by providing a tuned transistor amplifier which includes a plurality of transistor isolating stages between the selective networks of the amplifier. The active transistor isolating stages are coupled to the input and output of the signal attenuating network forming part of the AGC circuit. This attenuating network incorporates a diode controlled by the AGC voltage. The transistor isolating stages in conjunction with additional passive isolating elements prevent the resistive and reactive parameters of the diode from detuning the input and output selective networks and from varying the quality factor (Q) of these networks.

The novel features which are characteristic of this invention are set forth with particularity in the appended claims. The invention itself, however, both as to its organization and method of operation, together with further objectives and advantages thereof, may best be understood by reference to the following description taken in connection with the accompanying drawing in which:

The sole figure is a schematic circuit diagram of a transistor amplifier illustrating the instant invention.

The amplifier circuit, as shown in the sole figure of the drawing, includes two frequency selective networks 2 and 3, a transistor amplifier stage 4 having a PNP transistor connected in a common-emitter configuration, an active isolating element 5 connected to the input of amplifier 4, an automatic gain control circuit 6 connected between isolating element 5 and a further active isolating element 7. Isolating elements 5 and 7 are PNP transistors connected in the common-collector, or as it is more commonly referred to, the "emitter-follower" configuration. The emitter-followers isolate the impedance variations in the amplifier stage so that changes in input frequency selective circuit 2 has no effect on output frequency selective circuit 3, and conversely changes in frequency selective network 3 are not reflected into the selective network 2.

Frequency selective network 2 is shown as the input circuit for the amplifier and includes an input terminal or connection 8 which may be coupled to the preceding amplifier stage and which has the input signal impressed thereon. Network 2 is essentially a double-tuned resonant circuit and includes two variable inductive elements 9 and 10 and a variable common inductive element 11 connected to ground through a suitable decoupling capacitor 12. Inductors 10 and 11 are tuned by means of the voltage dividing capacitors 13 and 14 and inductors 9 and 11 may be tuned by the capacitors of the previous stage, not shown, or the distributed capacitance existing between input terminal and ground as shown by the dashed lines. Capacitors 13 and 14, in addition to resonating inductors 10 and 11, also act as an impedance dividing network. That is, the input impedance to emitter-follower 7, the base of which is connected to the junction of these capacitors, is substantially reduced since the impedance seen by the transistor, i.e., the generator impedance $Z_G$ of the input network, is not the impedance of network 2, but the impedance of capacitor 14; an impedance which is quite low compared both to the network impedance and transistor input impedance Z, at the operating frequencies. Thus it may be seen that contrary to normal usage, emitter-follower isolating stage 7 is working from a low impedance source.

Emitter-follower 7 includes a base 16, coupled to the junction of capacitors 13 and 14, an emitter 17 and a collector 18. Collector 18 is connected through a suitable resistance 19 to a common supply bus 20 which in turn is connected to the negative terminal of a source of supply voltage. Emitter 17 is connected to ground through emitter resistor 15 and to the AGC network through a coupling capacitor 22. Biasing conditions for emitter-follower 7 are established by the voltage dividing resistance network consisting of resistors 23 and 24 connected in series between the common bus 20 and ground; with base electrode 16 being connected to the junction of these resistances. The emitter-follower isolating stage 7 isolates the reactance variations of the AGC network 6 from the selective network 2 and, of course, enhances the isolation provided by emitter-follower 5.

The automatic gain control network includes a diode attenuating network for controlling the amplitude of the signal applied to amplifier 4 in response to the AGC voltage applied at the AGC terminal 25. This variable attenuating network consists of a voltage variable diode resistance element 26 and a shunt resistance element 27 connected between the anode of diode 26 and ground. In addition, the AGC network includes a shunt capacitor which limits the effect of variations of the capacitive reactance component of diode 26 thereby further enhancing isolation of output selective network 3. That is, since the depletion capacitance $C_D$ of diode 26 is connected in series with shunt capacitor 28, the total capacitance $C_T$ of the two capacitors is equal to their product divided by their sum, i.e., $$C_T = \frac{C_D \times C_T}{C_D + C_T}$$

Hence, if capacitor 28 is of the proper magnitude relative to the range of diode capacitance variations, the changes in diode capacitance with the conductivity of the diode will not produce any substantial variations in the total capacitance seen by "emitter-follower" 5 and will thus be effectively masked or "swamped" by the fixed capacitance 28.

The magnitude of the signal applied to the common emitter amplifier 4, and hence the gain of the amplifier stage, is controlled by AGC network 6 in response to the negative AGC voltage applied at the terminal 25. That is, the magnitude of the negative AGC voltage impressed on terminal 25 controls the conductivity of diode 26 and hence its resistance. The signal attenuating characteristics of the network consisting of diode 26 and resistance 27, therefore, varies with the applied AGC and controls the over-all gain of the amplifier stage.

The signal appearing at the output of the AGC circuit is coupled to the base 30 of emitter-follower 5 through a coupling capacitor 31. Emitter-follower 5 also includes a collector 32 connected to common supply bus 20 through a suitable resistance 33 and an emitter 34 connected to ground through an unbypassed emitter resistance 35. Biasing conditions for emitter-follower 5 are established by the voltage dividing network consisting of resistors 36 and 37 connected in series between common bus 20 and ground. Emitter-follower 5 functions to isolate impedance variations in both directions and thus prevents interaction between selective networks 2 and 3 as well as preventing any changes in impedance of AGC circuit 6 from the output selective network 3. That is, in addition to the various passive components included in the AGC circuit 6, which minimize the changes in resistivity and reactance of diode 26, emitter-follower further isolates these impedance changes and prevents these changes from being reflected into selective network 3.

Common-emitter amplifier 4 is coupled to emitter-follower 5 and includes a PNP transistor having a base 38, directly coupled to the emitter-follower stage 5, an emitter 39 and a collector 40. Emitter 39 is connected to ground through emitter resistor 41 which is bypassed for A.C. by a suitable bypass capacitor 42. Collector 40 is coupled directly to the output selective network 3 which is also a double-tuned resonant circuit consisting of two series connected variable inductors 44 and 45, a common variable inductor 46. The common inductor 46 is connected in series with decoupling capacitor 47 between the junction of inductors 44 and 45 and ground. Decoupling capacitor 47, in conjunction with the resistance 48, forms a decoupling network between the common supply bus and the output selective network 3.

A further resistance element 49 is connected between collector 40 of the common emitter stage and the junction of inductor 46 and capacitor 47. Resistor 49 mismatches the admittance $Y_L$ of the output load, i.e., the admittance of the selective network 3, and the output admittance $Y_O$ of transistor amplifier 4. In this fashion, the amplifier is initially mismatched providing a partial reduction in the internal feedback of the transistor thereby minimizing the reflected impedance. This manner of mismatching is a standard technique for reducing internal feedback and may or may not be used in conjunction with the active emitter-follower isolating stages 4 and 5. Inductors 44 and 46 are tuned for the amplifier frequency bandpass by the distributed capacitance existing across these inductors. It will be obvious, however, that fixed capacitors may be utilized to resonate these inductors. Inductors 45 and 47, on the other hand, are tuned by the series connected capacitors 50 and 51 connected between inductor 45 and ground. The junction of capacitors 50 and 51 is the output terminal of the amplifier stage and may be connected to the base electrode of the emitter-follower of the following amplifying stage.

Emitter-follower isolating stages 5 and 7 function to isolate the selective networks 2 and 3 from each other as well as isolating the varying reactance and resistive components introduced by AGC network 6. As pointed out previously, the diode 26 in this network introduces both a varying resistive and a varying reactive component as its conductivity is controlled in response to the AGC voltage impressed on terminal 25. By providing these emitter-follower isolating stages, any changes in the output selective network or in the automatic gain control circuitry, will not detune the input selective network and conversely. The manner in which emitter-followers 5 and 7 function to achieve this highly desirable result is analyzed in detail in the above identified co-pending Rhodes application. However, at this point, it is sufficient to state that any varying impedance in the input circuit of such an emitter-follower appears as a change in the output impedance of the emitter-follower but on a much reduced scale. That is, the change in input impedance appearing at the input terminals of the emitter-follower is divided effectively by the collector base current transfer ratio beta ($\beta$) of the transistor. And since beta ($\beta$) is on the order of 6 or 7 in commercially available transistors, it is seen that any variations in the input impedance to the emitter-follower may be reduced by approximately an order of magnitude. Hence, impedance changes due to changes in the AGC network 6 in no way affects the output selective network 3 since these changes in impedance appear at the input of emitter-follower 5 and hence their effect is substantially reduced and does not, for all practical purposes, interact with the output network 3. Furthermore, as pointed out previously, the capacitance 28 also acts to reduce the effects of changes in the capacitive reactance of diode 26 by virtue of the fact that the varying capacitance of diode 26 is in series with the fixed capacitor 28 and hence the total capacitance seen by the input terminal of emitter-follower 5 is a function of the product of these capacitances divided by their sum. In other words, the capacitance variation seen at the input of the emitter-follower is substantially reduced by capacitor 28. In addition, resistance 27, which forms part of the diode attenuating network limits the change in generator resistance appearing at the input of emitter-follower 5. Thus, emitter-follower 5 effectively isolates AGC circuit 6 in the forward direction and prevents it from deleteriously affecting output frequency selective network 3.

Looking into the opposite direction, it is also desirable that the variations in the resistive and reactive components of AGC network 6 be isolated from input selective network 2 to prevent any deleterious interaction with this network. Emitter-follower 7 performs this function. As was pointed out in the above identified concurrently filed application, emitter-follower 7 also has the additional characteristic that changes in the emitter-follower output load produces a change in the input impedance of the emitter-follower. However, this change in the input impedance is of no substantial consequence since the mismatch between the network and the emitter-follower is so large that any such change in the input impedance has very little effect. Thus the internal feedback is minimal and prevents interaction between the input selective network 2 and AGC circuit 6.

To sum up, the AGC network incorporated in the amplifier stage is isolated in both the forward and backward direction by means of the individual emitter-follower circuits 5 and 7 thereby isolating the AGC circuit from the input selective network 2 and the output selective network 3, thereby preventing any deleterious interaction between the AGC circuit and these networks.

A high frequency, bandpass amplifier circuit, with a center frequency of 70 mc. and a passband of 20 mc. was constructed using components having the following exemplary values, which are in no way limiting on the invention:

| | |
|---|---|
| Transistors **4, 5, 7** | 2N1742 PNP transistors. |
| Inductors **9, 10, 11, 44, 45, 46** | Approximately 1 microhenry. |
| Capacitor **12** | 470 picofarads. |
| Capacitor **13** | 5 picofarads. |
| Capacitor **14** | 27 picofarads. |
| Resistor **15** | 6.2 kilo ohms. |
| Resistor **19** | 1 kilo ohm. |
| Resistor **21** | 6.2 kilo ohms. |
| Resistor **22** | 470 picofarads. |
| Resistor **23** | 6.2 kilo ohms. |
| Resistor **24** | 7.5 kilo ohms. |
| Diode **26** | 1N2742. |
| Resistor **27** | 100 ohms. |
| Capacitor **28** | 33 picofarads. |
| Capacitor **31** | 470 picofarads. |
| Resistor **33** | 1 kilo ohm. |
| Resistor **35** | 6.2 kilo ohms. |
| Resistor **41** | 6.2 kilo ohms. |
| Capacitor **42** | 470 picofarads. |
| Capacitor **47** | 470 picofarads. |
| Resistor **48** | 1 kilo ohm. |
| Resistor **49** | 1 kilo ohm. |
| Capacitor **50** | 5 picofarads. |
| Capacitor **51** | 27 picofarads. |

The circuit thus constructed was operated in the stated frequency range without any measurable interaction between the frequency selective networks and/or the AGC circuitry.

It will be apparent from the above decription that a novel transistorized amplifier incorporating automatic gain control circuitry has been provided capable of high frequency, wide band operation, with a substantial isolation between the frequency selective networks and the automatic gain control circuitry. Furthermore, the desired isolation is achieved by means of two active, solid state devices in the form of emitter-follower stages, coupled on either side of the automatic gain control circuitry, thereby isolating this circuitry both from the input and output selective networks.

While a particular embodiment of this invention has been described and shown, it will, of course, be understood that the invention is not limited thereto, since many modifications, both in the circuit arrangement and in the components and instrumentalities for carrying out the invention may be made. It is contemplated that the appended claims cover any such modifications as may fall within the true spirit and scope of the invention.

What is claimed as new and deired to be secured by Letters Patent is:

1. In a wideband transistor amplifier having automatic gain control the combination comprising, an input selective network, an output selective network, a transistor amplifying stage and a variable signal attenuating circuit having variable resistive and reactive components coupled between said input and output networks, said attenuating network including a voltage sensitive device the conductivity of which is varied in response to an external automatic gain control voltage, and active network means for isolating impedance variations due to operation of said signal attenuating network for preventing interaction between said attenuating circuit and said input and output networks and between said networks themselves including active isolating stages coupled to the input and output of said attenuating circuit for isolating impedance variations in both directions between input and output whereby the varying resistive and reactive components of said circuit are not reflected into said input and output networks.

2. The bandpass transistor amplifier according to claim 1 wherein said voltage sensitive device is a diode.

3. In a wideband transistor amplifier having automatic gain control the combination comprising, a wideband input selective network, wideband output selective network, a transistor amplifying stage and a variable signal attenuating circuit having variable resistive and reactive components coupled between said input and output networks, said attenuating network being responsive to an external automatic gain control signal, a transistor isolating stage connected in the common collector configuration coupled between said input network and said attenuating circuit, and active means for isolating impedance variations produced due to operation of said attenuating network including a further transistor isolating stage connected in the common collector configuration coupled between the output of said attenuating circuit and said amplifying stage, said common collector isolating stages isolating impedance variations in both directions between input and output whereby the varying resistive and reactive components of said circuit are not reflected into said input and output networks.

References Cited by the Examiner

UNITED STATES PATENTS

| | | | |
|---|---|---|---|
| 2,983,875 | 5/61 | Zechter | 330—21 |
| 3,061,792 | 10/62 | Ebbinge | 330—21 |
| 3,074,026 | 1/63 | Kuzminsky | 330—145 X |

ROY LAKE, *Primary Examiner.*

NATHAN KAUFMAN, *Examiner.*